(12) United States Patent
Kumagai et al.

(10) Patent No.: US 8,110,422 B2
(45) Date of Patent: Feb. 7, 2012

(54) MANUFACTURING METHOD OF SEMICONDUCTOR LASER ELEMENT

(75) Inventors: Masayoshi Kumagai, Hamamatsu (JP); Kenshi Fukumitsu, Hamamatsu (JP); Koji Kuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 12/676,666

(22) PCT Filed: Sep. 2, 2008

(86) PCT No.: PCT/JP2008/065760
§ 371 (c)(1), (2), (4) Date: Jun. 3, 2010

(87) PCT Pub. No.: WO2009/031534
PCT Pub. Date: Mar. 12, 2009

(65) Prior Publication Data
US 2010/0240159 A1 Sep. 23, 2010

(30) Foreign Application Priority Data
Sep. 6, 2007 (JP) ................. P2007-231956

(51) Int. Cl.
*H01L 21/00* (2006.01)
(52) U.S. Cl. ................. 438/33; 257/E21.237
(58) Field of Classification Search ............ 438/33; 257/E21.237
See application file for complete search history.

(56) References Cited

U.S. PATENT DOCUMENTS 6,211,488 B1 * 4/2001 Hoekstra et al. ....... 219/121.72
6,865,201 B2 * 3/2005 Ito et al. ................. 372/45.01

(Continued)

FOREIGN PATENT DOCUMENTS
CN 1642687 7/2005
(Continued)

OTHER PUBLICATIONS

T. Sano et al., "Evaluation of Processing Characteristics of Silicon with Picosecond Pulse Laser," Preprints of the National Meeting of Japan Welding Society, Apr. 2000, No. 66, pp. 72-73, with English language translation.
D. Du et al., "Laser-induced breakdown by impact ionization in $SiO_2$ with pulse widths from 7 ns to 150 fs," Appl. Phys. Lett. 64 (23), Jun. 6, 1994, pp. 3071-3073.
S. Hirata, "Easy-to-understand Basics and Application of Semiconductor Lasers," CQ Publishing, Aug. 1, 2004, pp. 121-124, with English language translation.

(Continued)

*Primary Examiner* — Alexander G. Ghyka
*Assistant Examiner* — Stanetta Isaac
(74) *Attorney, Agent, or Firm* — Drinker Biddle & Reath LLP

(57) ABSTRACT

Starting point regions for cutting 8a, 8b extending along lines to cut 5a, 5b are initially formed in an object to be processed 1. The starting point regions for cutting 8b have modified regions 7b formed by irradiating the object 1 with laser light while locating a converging point within the object 1 and are formed in parts extending along the lines to cut 5b excluding portions 34b intersecting the lines to cut 5a. This makes the starting point regions for cutting 8b much less influential when cutting the object 1 from the starting point regions for cutting 8a acting as a start point, whereby bars with precise cleavage surfaces can reliably be obtained. Therefore, it is unnecessary to form a starting point region for cutting along the lines to cut 5b in each of a plurality of bars, whereby the productivity of semiconductor laser elements can be improved.

6 Claims, 18 Drawing Sheets

U.S. PATENT DOCUMENTS

| | | |
|---|---|---|
| 6,992,026 B2 | 1/2006 | Fukuyo et al. |
| 2005/0202596 A1 | 9/2005 | Fukuyo et al. |
| 2005/0224783 A1* | 10/2005 | Matsuyama et al. ............ 257/14 |
| 2006/0209395 A1* | 9/2006 | Sasaoka ........................ 359/344 |
| 2007/0190748 A1 | 8/2007 | Nakamura |

FOREIGN PATENT DOCUMENTS

| | | |
|---|---|---|
| JP | 2003-017791 | 1/2003 |
| JP | 2003-338468 | 11/2003 |
| JP | 2007-214604 | 8/2007 |
| JP | 2007-220909 | 8/2007 |
| WO | WO 2009/057558 | 5/2009 |

OTHER PUBLICATIONS

K. Hayashi, "Inner Glass Marking by Harmonics of Solid State Laser," Proceedings of 45th Laser Materials Processing Conference, Dec. 1998, pp. 23-28, with English Abstract.

K. Miura et al, "Formation of Photo-induced Structures in Glasses with Femtosecond Laser," Proceedings of 42nd Laser Materials Processing Conference, Nov. 1997, pp. 105-111, with English Abstract.

"Semiconductor Laser," Publishing House of Electronics Industry, Feb. 29, 2000 (partial English-language translation attached).

* cited by examiner

STRIPE DIRECTION

MANUFACTURING METHOD OF SEMICONDUCTOR LASER ELEMENT

TECHNICAL FIELD

The present invention relates to a method of manufacturing a semiconductor laser element having a stripe structure.

BACKGROUND ART

It has conventionally been typical for semiconductor laser elements having stripe structures to be manufactured as described in Non Patent Literature 1, for example.

That is, an object to be processed in which a plurality of semiconductor laser parts to become semiconductor laser elements are arranged in a two-dimensional matrix is initially prepared. Then, the object is scratched with a scriber such as a diamond cutter along end parts of lines to cut extending orthogonal to a stripe direction between the semiconductor laser parts (primary scribing). Subsequently, the object is cleaved along the lines to cut from thus formed scratches acting as a start point, so as to yield a plurality of bars each having a plurality of semiconductor laser parts arranged one-dimensionally.

Thereafter, the cleavage surfaces of the bars orthogonal to the stripes are coated with dielectric films which become protective films or reflection control films. Then, each bar is scratched with a scriber such as a diamond cutter along the lines to cut extending along the stripe direction between the semiconductor laser parts (secondary scribing). Subsequently, the bar is cleaved along the lines to cut from the resulting scratches acting as a start point, whereby a plurality of semiconductor laser elements are obtained.

The following is the reason why a plurality of bars are obtained by cleaving the object from scratches formed by the primary scribing acting as a start point and then each of the plurality of bars is subjected to the secondary scribing. That is, if the object is initially subjected to both of the primary scribing and secondary scribing, the scratches formed by the secondary scribing may affect the object cleaving from the scratches made by the primary scribing, thereby failing to yield bars with precise cleavage surfaces.

Non Patent Literature 1: Hirata, Shoji, "Understanding Fundamentals and Applications of Semiconductor Lasers", 3d ed., CQ Publishing Co., Ltd., Aug. 1, 2004, pp. 121-124

DISCLOSURE OF INVENTION

Technical Problem

As mentioned above, the conventionally typical semiconductor laser element manufacturing method has been problematic in that each of a plurality of bars obtained by cleaving the object must be subjected to the secondary scribing, which makes its operation very cumbersome and lowers the productivity.

In view of such circumstances, it is an object of the present invention to provide a method of manufacturing a semiconductor laser element with a high productivity.

Solving Means

For achieving the above-mentioned object, the method of manufacturing a semiconductor laser element in accordance with the present invention is a method of manufacturing a semiconductor laser element having a stripe structure, the method comprising the steps of forming in an object to be processed having a plurality of two-dimensionally arranged semiconductor laser parts to become semiconductor laser elements a first starting point region for cutting along at least a part of a first line to cut extending orthogonal to a stripe direction between the semiconductor laser parts and irradiating the object with laser light while locating a converging point within the object, so as to form a second starting point region for cutting having a modified region along the stripe direction between the semiconductor laser parts; cutting the object along the first line to cut from the first starting point region for cutting acting as a start point, so as to yield a plurality of bars each having a plurality of semiconductor laser parts arranged one-dimensionally; and cutting the bar along the second line to cut from the second starting point region for cutting acting as a start point, so as to yield a plurality of semiconductor laser elements.

This semiconductor laser element manufacturing method initially forms both of the first starting point region for cutting extending along at least a part of the first line to cut and the second starting point region for cutting extending along the second line to cut in the object. Here, the second starting point region for cutting has a modified region formed by irradiating the object with laser light while locating a converging point within the object. This makes the second starting point region for cutting less influential than scratches and the like, for example, when cutting the object from the first starting point region for cutting acting as a start point, whereby bars with precise cleavage surfaces can be obtained. Therefore, it is unnecessary to form the second starting point region for cutting along the second line to cut in each of a plurality of bars, whereby the productivity of semiconductor laser elements can be improved. The forming of the first starting point region for cutting along at least a part of the first line to cut and the forming of the second starting point region for cutting along the second line to cut may be carried out in any order.

Preferably, in the method of manufacturing a semiconductor laser element in accordance with the present invention, the step of forming the first and second starting point regions for cutting forms the second starting point region for cutting along the second line to cut such that a second cutting force required for cutting the object along the second line to cut from the second starting point region for cutting acting as a start point is greater than a first cutting force required for cutting the object along the first line to cut from the first starting point region for cutting acting as a start point. Thus forming the second starting point region for cutting can reliably prevent the object from being cut from the second starting point region for cutting acting as a start point when cutting the object from the first starting point region for cutting acting as a start point.

Preferably, in the method of manufacturing a semiconductor laser element in accordance with the present invention, the step of forming the first and second starting point regions for cutting forms the second starting point region for cutting in the object along the second line to cut in a part extending along the second line to cut excluding a portion intersecting the first line to cut. Thus forming the second starting point region for cutting can make the second starting point region for cutting much less influential when cutting the object from the first starting point region for cutting acting as a start point, whereby bars with precise cleavage surfaces can be obtained reliably.

Preferably, in the method of manufacturing a semiconductor laser element in accordance with the present invention, the step of forming the first and second starting point regions for cutting irradiates the object with laser light while locating a converging point within the object, so as to form a first starting point region for cutting having a modified region along at least a part of the first line to cut. This allows both of the first and second starting point regions for cutting to be initially formed in the object by a laser processing apparatus alone, whereby the productivity of semiconductor laser elements can further be improved.

Preferably, in this case, the step of forming the first and second starting point regions for cutting forms the first starting point region for cutting in the object along the first line to cut in a part extending along the first line to cut excluding a portion to become a resonance surface of the semiconductor laser element. This can prevent the resonance surface of the semiconductor laser element from scattering the laser light and lowering the reflectance of the laser light.

Preferably, between the step of yielding a plurality of bars and the step of yielding a plurality of semiconductor laser elements, the method of manufacturing a semiconductor laser element in accordance with the present invention includes the step of forming a dielectric film on an end face orthogonal to the stripe direction in the bars. This allows a protective film or reflection control film to be efficiently formed in a portion to become a resonance surface of the semiconductor laser element.

Advantageous Effects of Invention

The present invention can improve the productivity of semiconductor laser elements.

REFERENCE SIGNS LIST

Figure 1:
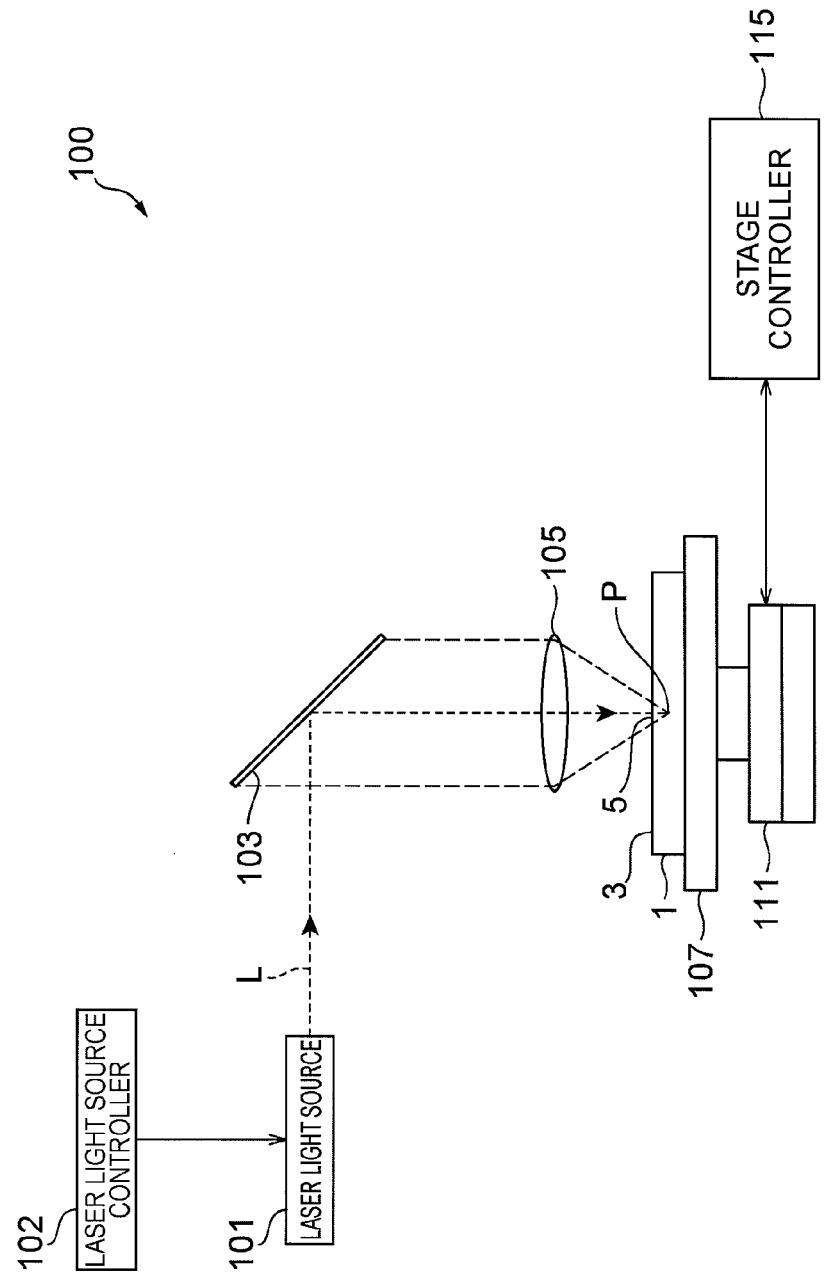
FIG. 1 is a schematic structural diagram of a laser processing apparatus, used for forming a modified region.

1 . . . object to be processed; 5a . . . line to cut (first line to cut); 5b . . . line to cut (second line to cut); 7a, 7b . . . modified region; 8a . . . starting point region for cutting (first starting point region for cutting); 8b . . . starting point region for cutting (second starting point region for cutting); 34 . . . semiconductor laser part; 34a . . . portion to become a resonance surface; 34b . . . intersecting portion; 37 . . . bar; 37a . . . cleavage surface (end face orthogonal to the stripe direction in a bar); 38 . . . dielectric film; 39 . . . semiconductor laser element; L . . . laser light; P . . . converging point

DESCRIPTION OF EMBODIMENTS

In the following, a preferred embodiment of the present invention will be explained in detail with reference to the drawings. In the drawings, the same or equivalent parts will be referred to with the same signs while omitting their overlapping explanations.

The method of manufacturing a semiconductor laser element in accordance with this embodiment irradiates a planar object to be processed with laser light while locating a converging point at the object, so as to form a modified region in the object along a line to cut the object.

Therefore, to begin with, the forming of a modified region in the method of manufacturing a semiconductor laser element in accordance with this embodiment will be explained with reference to FIGS. 1 to 9.

As illustrated in FIG. 1, a laser processing apparatus 100 comprises a laser light source 101 for pulsatingly oscillating laser light (processing laser light) L, a dichroic mirror 103 arranged such as to change the direction of the optical axis of the laser light L by 90°, and a condenser lens 105 for converging the laser light L. The laser processing apparatus 100 further comprises a support table 107 for supporting an object to be processed 1 which is irradiated with the laser light L converged by the condenser lens 105, a stage 111 for moving the support table 107 along X, Y, and Z axes, a laser light source controller 102 for regulating the laser light source 101 in order to adjust the output, pulse width, and the like of the laser light L, and a stage controller 115 for regulating movements of the stage 111.

In the laser processing apparatus 100, the laser light L emitted from the laser light source 101 changes the direction of its optical axis by 90° with the dichroic mirror 103, and then is converged by the condenser lens 105 into the object 1 mounted on the support table 107. At the same time, the stage 111 is shifted, so that the object 1 is moved relative to the laser light L along a line to cut 5. As a consequence, a modified region to become a cutting start point is formed in the object 1 along the line to cut 5. This modified region will be explained in detail in the following.

Figure 2:
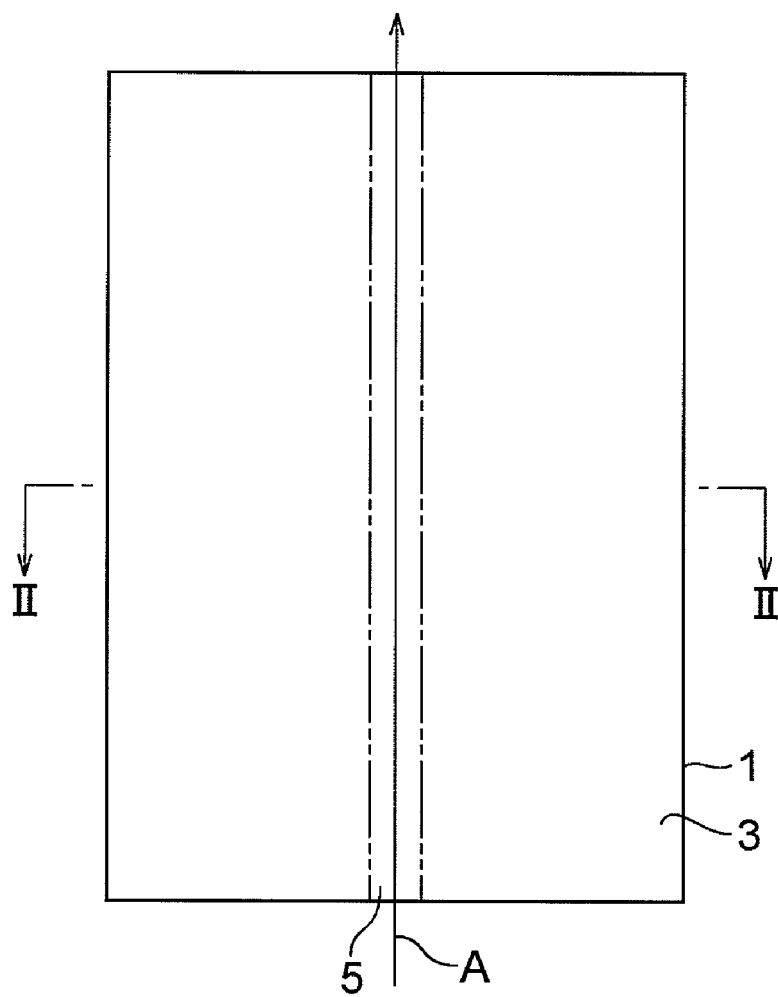
FIG. 2 is a plan view of an object to be processed for which the modified region is formed.
Figure 3:
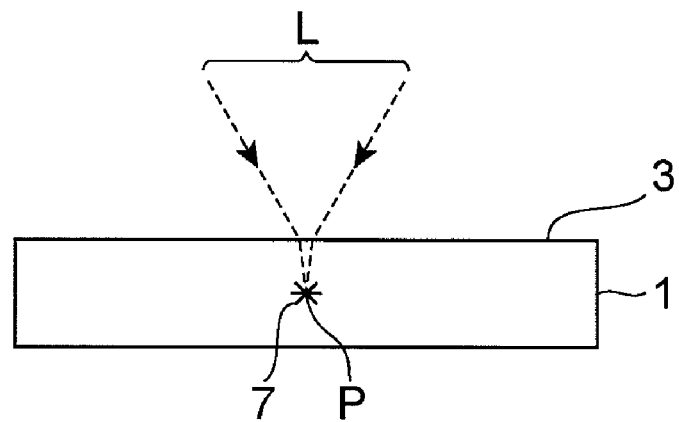
FIG. 3 is a sectional view of the object taken along the line II-II of FIG. 2.
Figure 4:
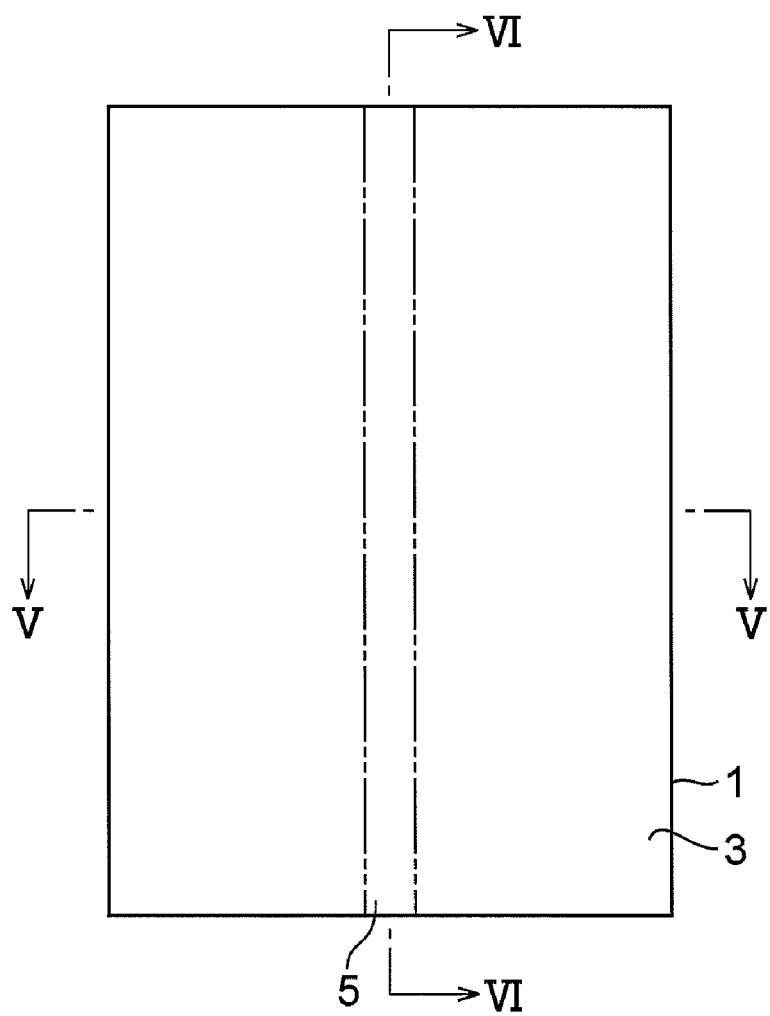
FIG. 4 is a plan view of the object after laser processing.
Figure 5:
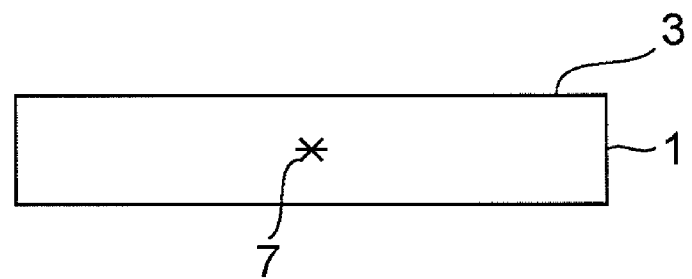
FIG. 5 is a sectional view of the object taken along the line V-V of FIG. 4.
Figure 6:
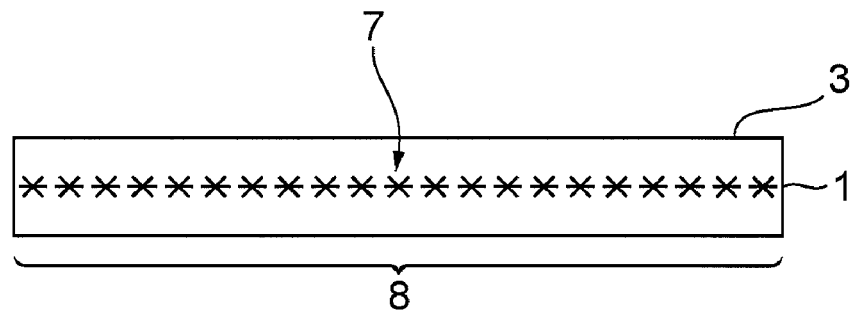
FIG. 6 is a sectional view of the object taken along the line VI-VI of FIG. 4.

As illustrated in FIG. 2, the line to cut 5 for cutting the planar object 1 is set therein. The line to cut 5 is a virtual line extending straight. When forming a modified region within the object 1, the laser light L is relatively moved along the line to cut 5 (i.e., in the direction of arrow A in FIG. 2) while locating a converging point P within the object 1 as illustrated in FIG. 3. This forms a modified region 7 within the object 1 along the line to cut 5 as illustrated in FIGS. 4 to 6, whereby the modified region 7 formed along the line to cut 5 becomes a starting point region for cutting 8.

The converging point P is a position at which the laser light L is converged. The line to cut 5 may be curved instead of being straight, and may be a line actually drawn on the front face 3 of the object 1 without being restricted to the virtual line. The modified region 7 may be formed either continuously or intermittently. It will be sufficient if the modified region 7 is formed at least within the object 1. There are cases where fractures are formed from the modified region 7 acting as a start point, and the fractures and modified region 7 may be exposed at outer surfaces (the front face, rear face, and outer peripheral face) of the object 1.

Here, the laser light L is absorbed in particular in the vicinity of the converging point within the object 1 while being transmitted therethrough, whereby the modified region 7 is formed in the object 1 (i.e., internal absorption type laser processing). Therefore, the front face 3 of the object 1 hardly absorbs the laser light L and thus does not melt. In the case of forming a removing part such as a hole or groove by melting it away from the front face 3 (i.e., surface absorption type laser processing), the processing region gradually progresses from the front face 3 side to the rear face side in general.

The modified region formed by the method of manufacturing a semiconductor laser element in accordance with this embodiment refers to regions whose physical characteristics such as density, refractive index, and mechanical strength have attained states different from those of their surroundings. Examples of the modified region include (1) molten processed regions, (2) crack regions or dielectric breakdown regions, (3) refractive index changed regions, and their mixed regions.

The modified region in the method of manufacturing a semiconductor laser element in accordance with this embodiment is formed by local absorption of laser light or a phenomenon known as multiphoton absorption. A material becomes transparent when its absorption bandgap $E_G$ is greater than photon energy hv, so that a condition under which absorption occurs in the material is $hv > E_G$. However, even when optically transparent, the material generates absorption under a condition of $nhv > E_G$ (where n=2, 3, 4, . . . ) if the intensity of laser light L becomes very high. This phenomenon is known as multiphoton absorption. The forming of a molten processed region by multiphoton absorption is disclosed, for example, in "Silicon Processing Characteristic Evaluation by Picosecond Pulse Laser", Preprints of the National Meetings of Japan Welding Society, Vol. 66 (April, 2000), pp. 72-73.

Also, modified regions formed by employing ultrashort-pulsed laser light having a pulse width of several picoseconds to femtoseconds may be utilized as described in D. Du, X. Liu, G. Korn, J. Squier, and G. Mourou, "Laser Induced Breakdown by Impact Ionization in $SiO_2$ with Pulse Widths from 7 ns to 150 fs", Appl. Phys. Lett. 64(23), Jun. 6, 1994.

(1) Case where the Modified Region Includes a Molten Processed Region

An object to be processed (e.g., semiconductor material such as silicon) is irradiated with the laser light L while locating a converging point within the object under a condition with a field intensity of at least $1 \times 10^8$ (W/cm$^2$) at the converging point and a pulse width of 1 μs or less. As a consequence, the laser light L is absorbed in the vicinity of the converging point, so that the inside of the object is locally heated, and this heating forms a molten processed region within the object.

The molten processed region encompasses regions once molten and then re-solidified, regions just in a molten state, and regions in the process of being re-solidified from the molten state, and can also be referred to as a region whose phase has changed or a region whose crystal structure has changed. The molten processed region may also be referred to as a region in which a certain structure changes to another structure among monocrystal, amorphous, and polycrystal structures. For example, it means a region having changed from the monocrystal structure to the amorphous structure, a region having changed from the monocrystal structure to the polycrystal structure, or a region having changed from the monocrystal structure to a structure containing amorphous and polycrystal structures. When the object to be processed is of a silicon monocrystal structure, the molten processed region is an amorphous silicon structure, for example.

Figure 7:
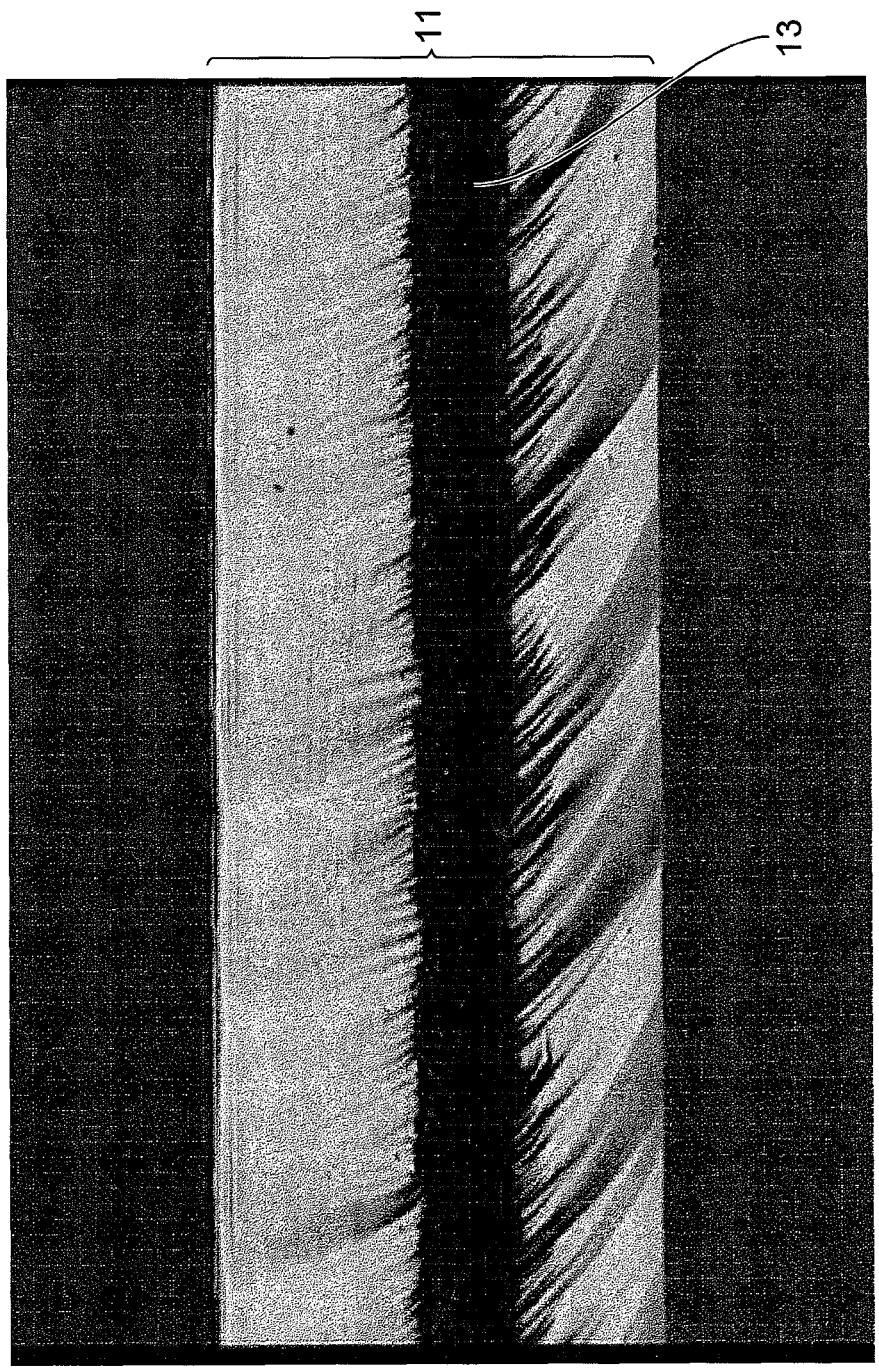
FIG. 7 is a view illustrating a photograph of a cut section of a silicon wafer after laser processing.

FIG. 7 is a view illustrating a photograph of a cross section in a part of a silicon wafer (semiconductor substrate) irradiated with laser light. As illustrated in FIG. 7, a molten processed region 13 is formed within a semiconductor substrate 11.

Figure 8:
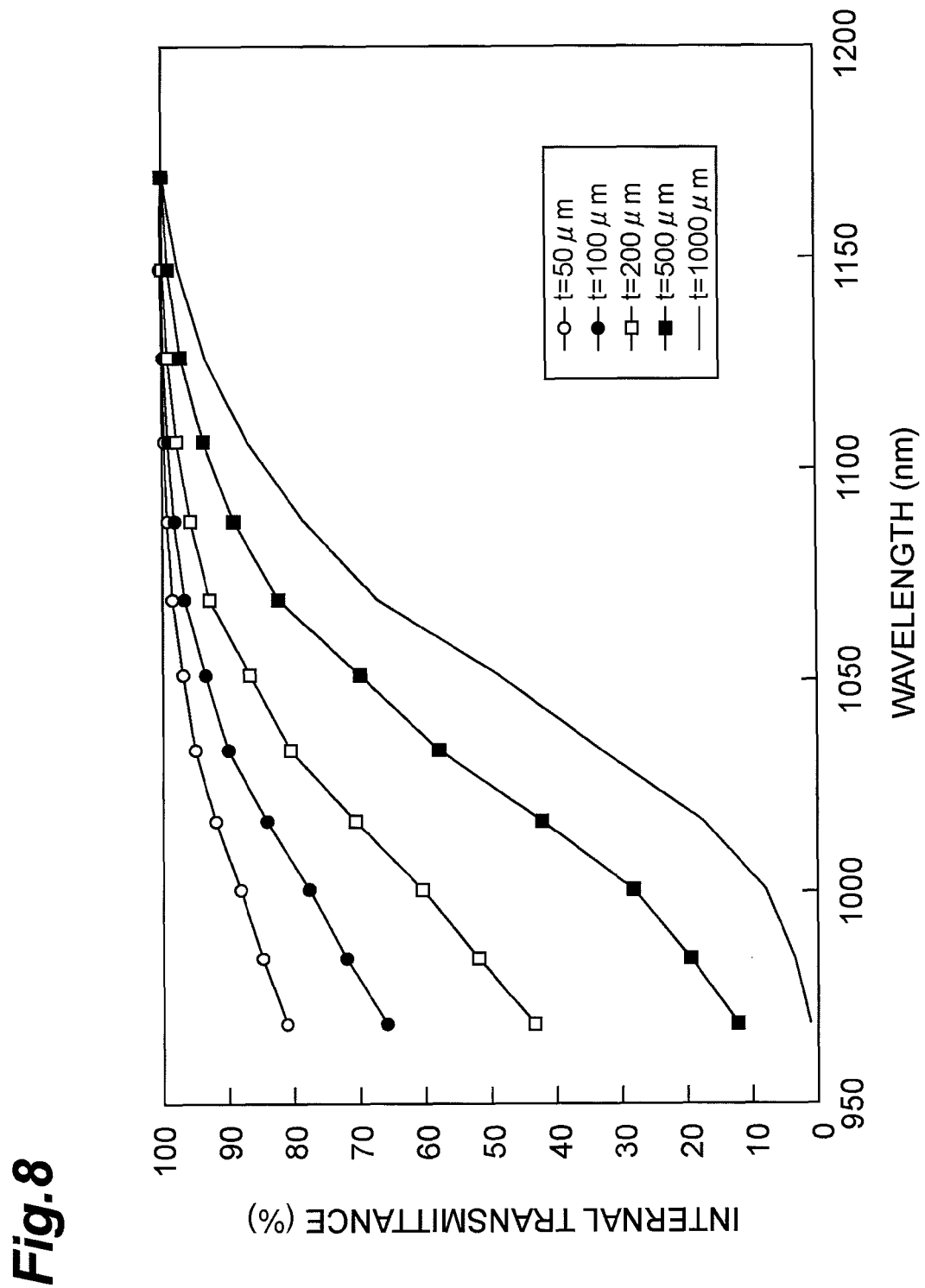
FIG. 8 is a graph illustrating relationships between the laser light wavelength and the transmittance within a silicon substrate.

The fact that the molten processed region 13 is formed within a material transparent to the wavelength of laser light incident thereon will now be explained. FIG. 8 is a graph illustrating relationships between the laser light wavelength and the transmittance within the silicon substrate. Here, the respective reflected components on the front and rear face sides of the silicon substrate are eliminated, so as to indicate the internal transmittance alone. The respective relationships are represented in the cases where the thickness t of the silicon substrate is 50 μm, 100 μm, 200 μm, 500 μm, and 1000 μm.

For example, at the Nd:YAG laser wavelength of 1064 nm, the laser light L appears to be transmitted through the silicon substrate by at least 80% when the silicon substrate has a thickness of 500 μm or less. Since the semiconductor substrate 11 represented in FIG. 7 has a thickness of 350 μm, the molten processed region 13 caused by multiphoton absorption is formed near the center of the semiconductor substrate 11, i.e., at a part distanced from the front face by 175 μm. The transmittance in this case is 90% or more with reference to a silicon wafer having a thickness of 200 μm, whereby the laser light L is absorbed only slightly within the semiconductor substrate 11 but is substantially transmitted therethrough. When converged within the silicon wafer under the condition of at least $1 \times 10^8$ (W/cm$^2$) with a pulse width of 1 μs or less, however, the laser light L is locally absorbed at the converging point and its vicinity, whereby the molten processed region 13 is formed within the semiconductor substrate 11.

There is a case where fractures occur in the silicon wafer from the molten processed region acting as a start point. There is also a case where fractures are formed as being incorporated in the molten processed region. In the latter case, the fractures may be formed over the whole surface of the molten processed region or in only a part or a plurality of parts thereof. These fractures may grow naturally or as a force is exerted on the silicon wafer. The fractures naturally growing from the molten processed region include both of cases where they grow from a state in which the molten processed region is molten and where they grow when the molten processed region is re-solidified from the molten state. In either case, the molten processed region is formed only within the silicon wafer and, when at a cut section, within the cut section as illustrated in FIG. 7.

(2) Case where the Modified Region Includes a Crack Region

An object to be processed (e.g., glass or a piezoelectric material made of $LiTaO_3$) is irradiated with the laser light L while locating a converging point therewithin under a condition with a field intensity of at least $1 \times 10^8$ (W/cm$^2$) at the converging point and a pulse width of 1 µs or less. This magnitude of pulse width is a condition under which the laser light L is absorbed within the object so that a crack region is formed therein. This generates a phenomenon of optical damage within the object. This optical damage induces a thermal distortion within the object, thereby forming a crack region including a crack or a plurality of cracks within the object. The crack region may also be referred to as a dielectric breakdown region.

Figure 9:
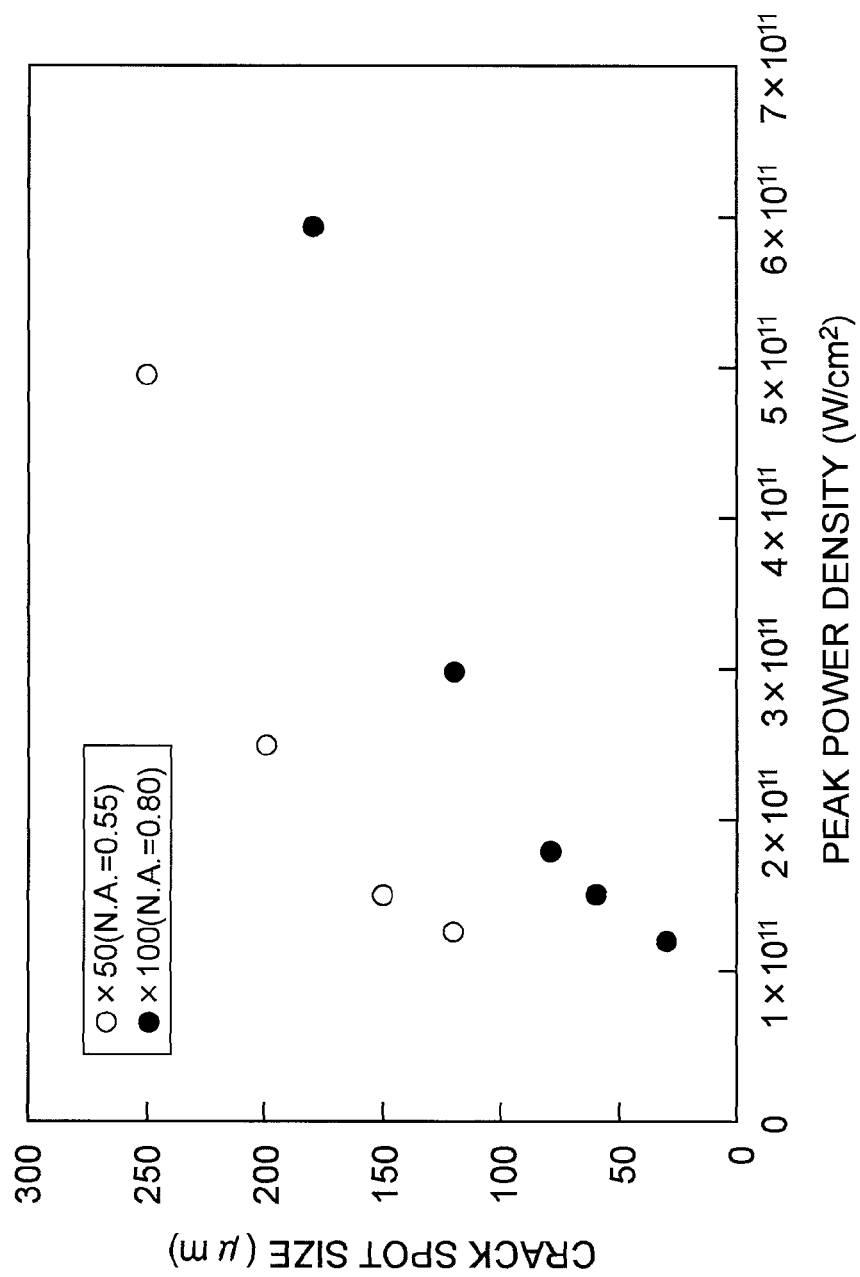
FIG. 9 is a graph illustrating relationships between the peak power density of laser light and crack spot size.

FIG. 9 is a graph illustrating results of experiments concerning relationships between the field intensity and crack size. The abscissa indicates the peak power density. Since the laser light L is pulsed laser light, the field intensity is represented by the peak power density. The ordinate indicates the size of a crack part (crack spot) formed within the object by one pulse of laser light L. Crack spots gather to yield a crack region. The crack spot size is the size of a part yielding the maximum length among forms of crack spots. Data represented by black circles in the graph refer to a case where the condenser lens (C) has a magnification of ×100 and a numerical aperture (NA) of 0.80. On the other hand, data represented by whitened circles in the graph refer to a case where the condenser lens (C) has a magnification of ×50 and a numerical aperture (NA) of 0.55. Crack spots are seen to occur within the object from when the peak power density is about $10^{11}$ (W/cm$^2$) and become greater as the peak power density increases.

(3) Case where the Modified Region Includes a Refractive Index Changed Region

An object to be processed (e.g., glass) is irradiated with the laser light L while locating a converging point within the object under a condition with a field intensity of at least $1 \times 10^8$ (W/cm$^2$) at the converging point and a pulse width of 1 ns or less. When the laser light L is thus absorbed within the object while having a very short pulse width, its energy is not converted into thermal energy, whereby an eternal structure change such as ion valence change, crystallization, or orientation polarization is induced within the object, thus forming a refractive index changed region.

The modified region, which encompasses the molten processed regions, dielectric breakdown regions, refractive index changed regions, and their mixed regions, may be an area where the density of the modified region has changed from that of an unmodified region in the material or an area formed with a lattice defect. They can collectively be referred to as a high-density transitional region.

The molten processed regions, refractive index changed regions, areas where the modified region has a density different from that of the unmodified region, or areas formed with a lattice defect may further incorporate a fracture (cut or microcrack) therewithin or at an interface between the modified and unmodified regions. The incorporated fracture may be formed over the whole surface of the modified region or in only a part or a plurality of parts thereof.

The object can be cut with a favorable precision if the modified region is formed as follows while taking account of the crystal structure of the object, its cleavage characteristic, and the like.

That is, in the case of a substrate made of a monocrystal semiconductor having a diamond structure such as silicon, it will be preferred if the modified region is formed in a direction extending along a (111) plane (first cleavage plane) or a (110) plane (second cleavage plane). In the case of a substrate made of a group III-V compound semiconductor of sphalerite structure such as GaAs, it will be preferred if the modified region is formed in a direction extending along a (110) plane.

In the case of a substrate having a crystal structure of hexagonal system such as sapphire (Al$_2$O$_3$), it will be preferred if the modified region is formed in a direction extending along a (1120) plane (A plane) or a (1100) plane (M plane) while using a (0001) plane (C plane) as a principal plane.

When the substrate is formed with an orientation flat in a direction to be formed with the above-mentioned modified region (e.g., a direction extending along a (111) plane in a monocrystal silicon substrate) or a direction orthogonal to the direction to be formed therewith, the modified region can be formed easily and accurately in the substrate with reference to the orientation flat.

The method of manufacturing a semiconductor laser element in accordance with this embodiment will now be explained.

Figure 10:
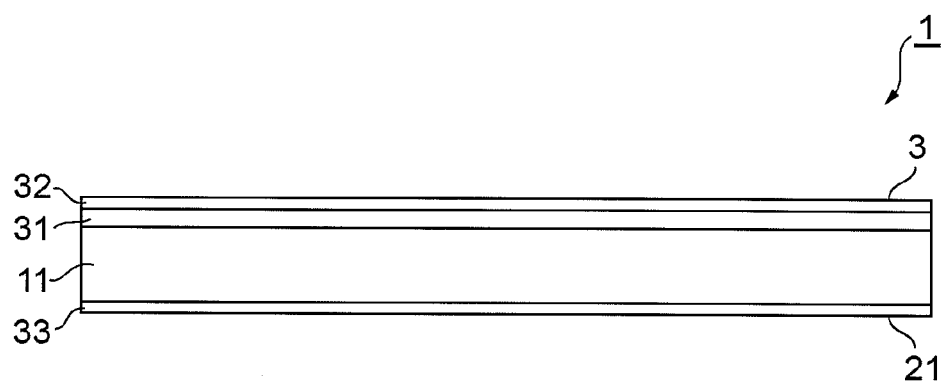
FIG. 10 is a side view of an object to be processed for which the method of manufacturing a semiconductor laser element in accordance with an embodiment is employed.

FIG. 10 is a side view of an object to be processed for which the method of manufacturing a semiconductor laser element in accordance with this embodiment is employed. As illustrated in FIG. 10, the planar object 1 comprises a semiconductor substrate 11 made of GaAs or the like, an epitaxially grown crystal layer 31 formed on the front face of the semiconductor substrate 11, an anode layer 32 formed on the front face of the epitaxially grown crystal layer 31, and a cathode layer 33 formed on the rear face of the semiconductor substrate 11. The epitaxially grown crystal layer 31 has a cladding layer made of AlGaAs or the like and an active layer made of GaAs or the like.

Figure 11:
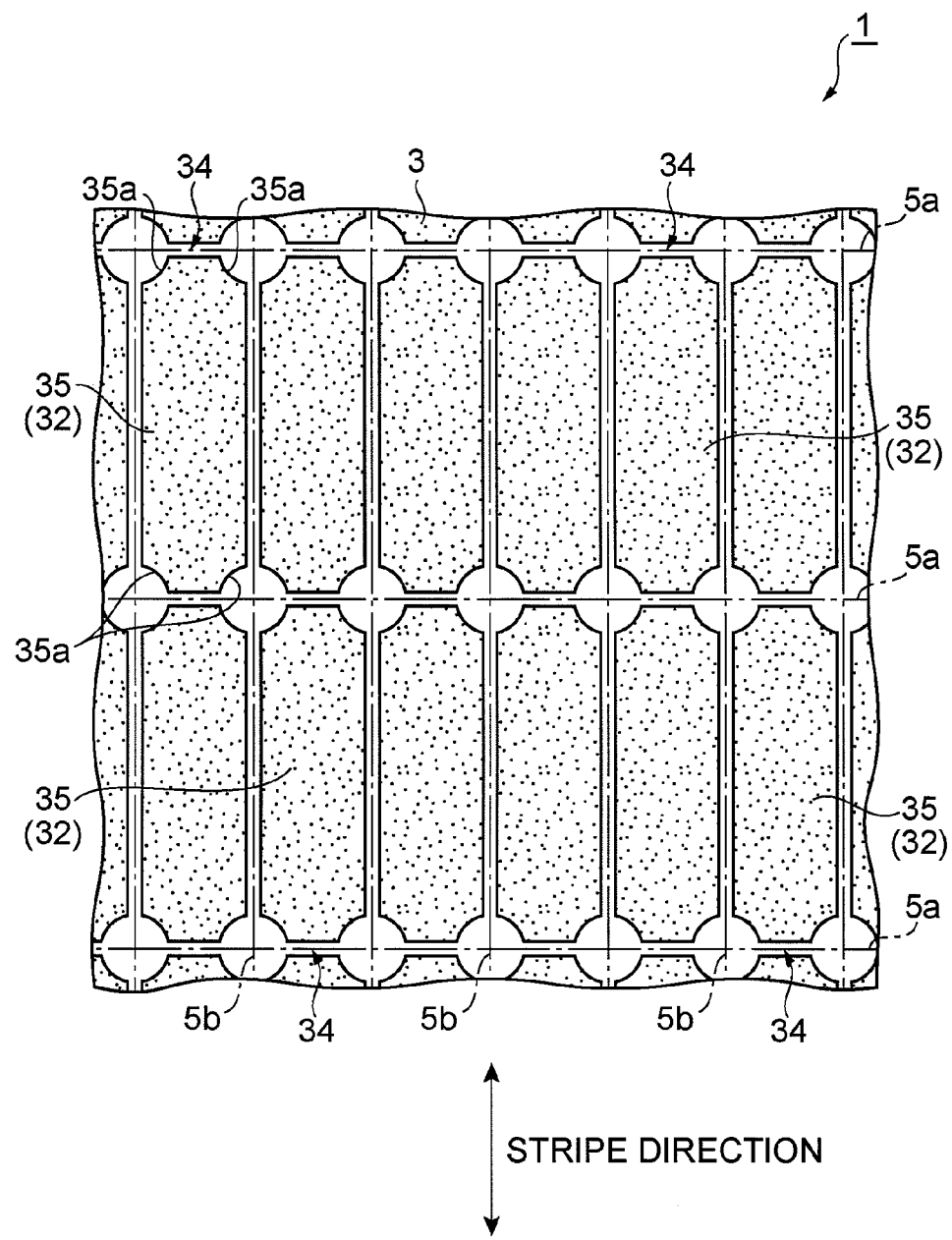
FIG. 11 is a partly enlarged view on the front face side of the object of FIG. 10.
Figure 12:
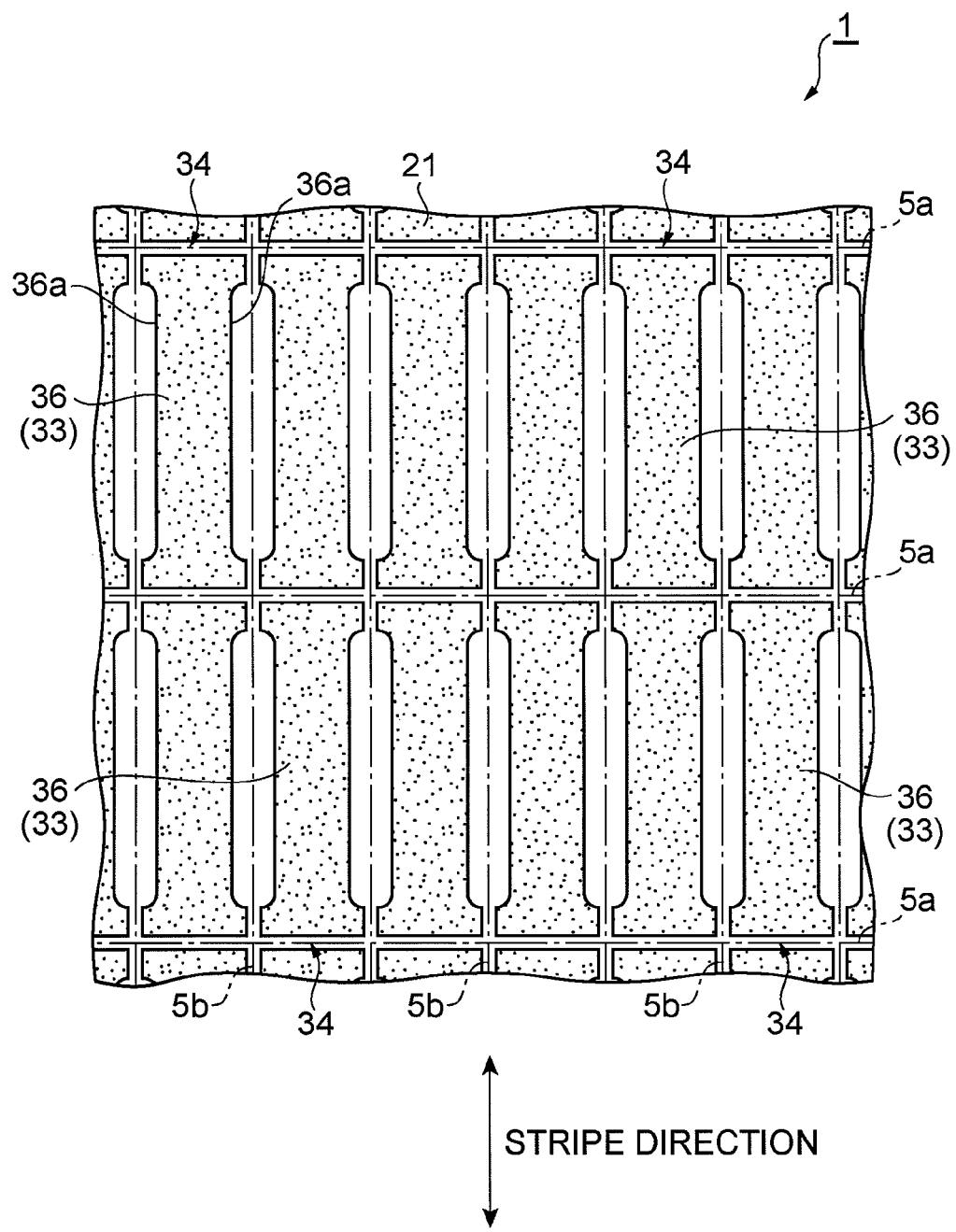
FIG. 12 is a partly enlarged view on the rear face side of the object of FIG. 10.

FIGS. 11 and 12 are partly enlarged views of the object of FIG. 10 on the front and rear face sides, respectively. As illustrated in FIGS. 11 and 12, the object 1 is constituted by a plurality of semiconductor laser parts 34, each shaped into a rectangular plate (having an outer form of 600 µm×200 µm with a thickness of 120 µm) and adapted to become a semiconductor laser element having a stripe structure, which are arranged in a two-dimensional matrix. In the object 1, lines to cut (first lines to cut) 5a extending orthogonal to a stripe direction (resonance direction of laser light in the semiconductor laser elements) between the semiconductor laser parts 34, 34 and lines to cut (second lines to cut) 5b extending along the stripe direction are set like grids.

The lines to cut 5a, 5b are set along (011) and (0-1-1) planes when the semiconductor substrate 11 is made of GaAs, and along (1-100) and (−1100) planes when the semiconductor substrate 11 is made of GaN.

As illustrated in FIG. 11, the anode layer 32 has rectangular anodes 35 formed in the respective semiconductor laser parts 34. The anodes 35, 35 adjacent to each other in the row and column directions are formed with a gap of several micrometers therebetween, while four corners of each anode 35 are formed with cutouts 35a. As illustrated in FIG. 12, the cathode layer 33 has rectangular cathodes 36 formed in the respective semiconductor laser parts 34. The cathodes 36, 36 adjacent to each other in the row and column directions are formed with a gap of several micrometers therebetween, while two sides of each cathode 36 orthogonal to the stripe direction are formed with cutouts 36a leaving their both end portions.

The method of manufacturing a semiconductor laser element in accordance with this embodiment is employed for thus constructed object 1.

Figure 13:
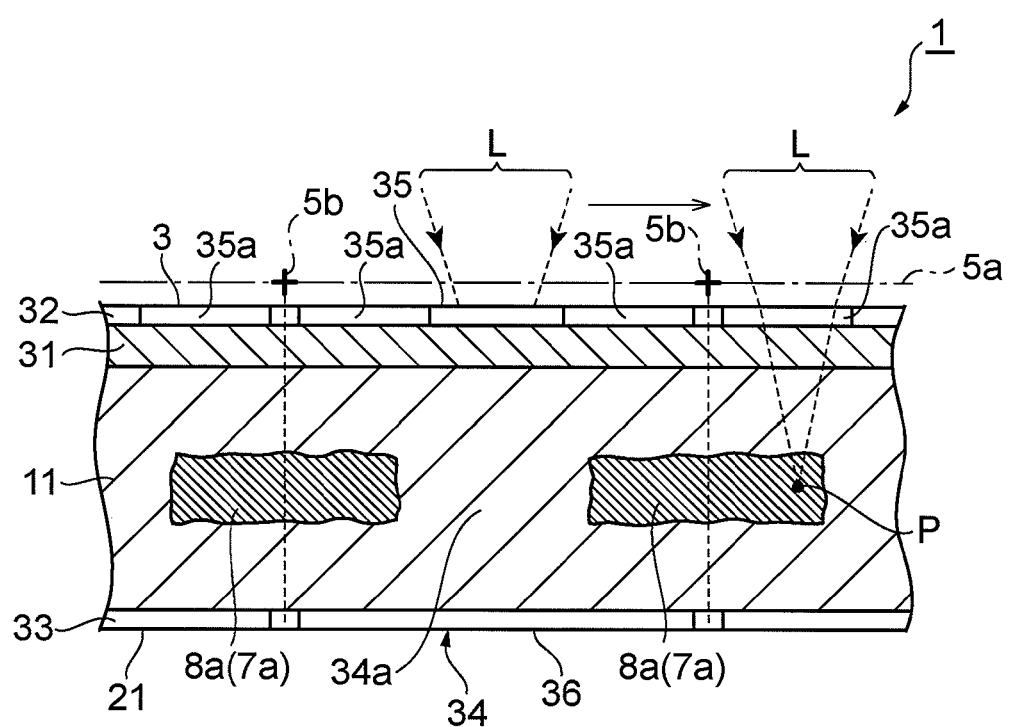
FIG. 13 is a partly enlarged longitudinal sectional view of the object of FIG. 11 taken along a line to cut extending orthogonal to the stripe direction between semiconductor laser parts.
Figure 15:
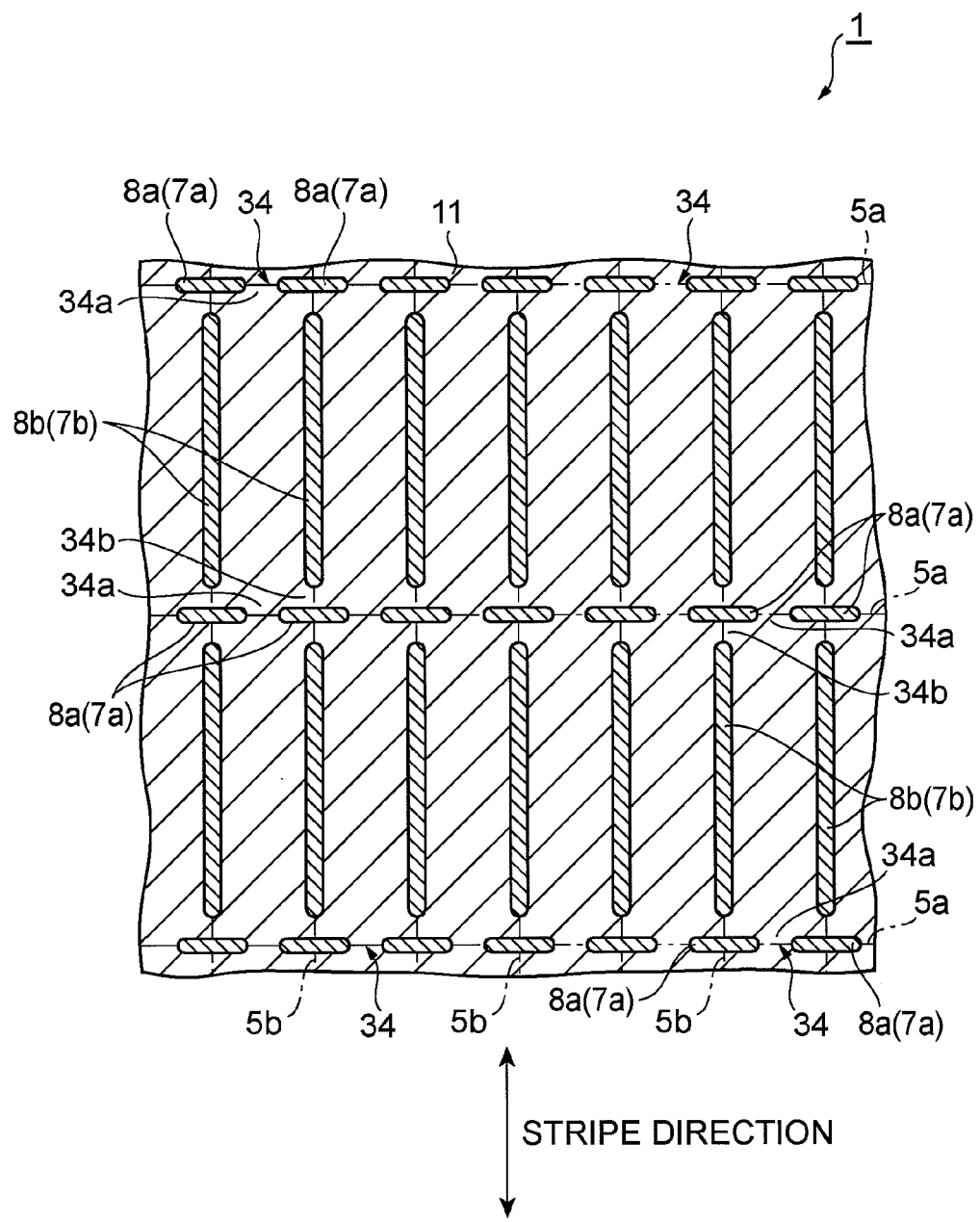
FIG. 15 is a partly enlarged transverse sectional view of the object of FIG. 11 after forming starting point regions for cutting.

First, the object 1 is fixed onto a support table of a laser processing apparatus (not depicted). Then, as illustrated in FIG. 13, the object 1 is irradiated with the laser light L while using its front face 3 as a laser light entrance surface and locating a converging point P within the semiconductor substrate 11, and the support table is moved, so as to scan the laser light L along the lines to cut 5a. Here, since the anodes 35 are formed with the gap of about several micrometers therebetween on both sides of the lines to cut 5a, the laser light L is converged within the semiconductor substrate 11 only in the portions held among the cutouts 35a of the anodes 35 on the lines to cut 5a. Consequently, as illustrated in FIG. 15, modified regions 7a including molten processed regions are formed in the object 1 along the lines to cut 5a in the parts extending along the lines to cut 5a excluding portions 34a to become resonance surfaces of semiconductor laser elements, so as to become starting point regions for cutting (first starting point regions for cutting) 8a.

Figure 14:
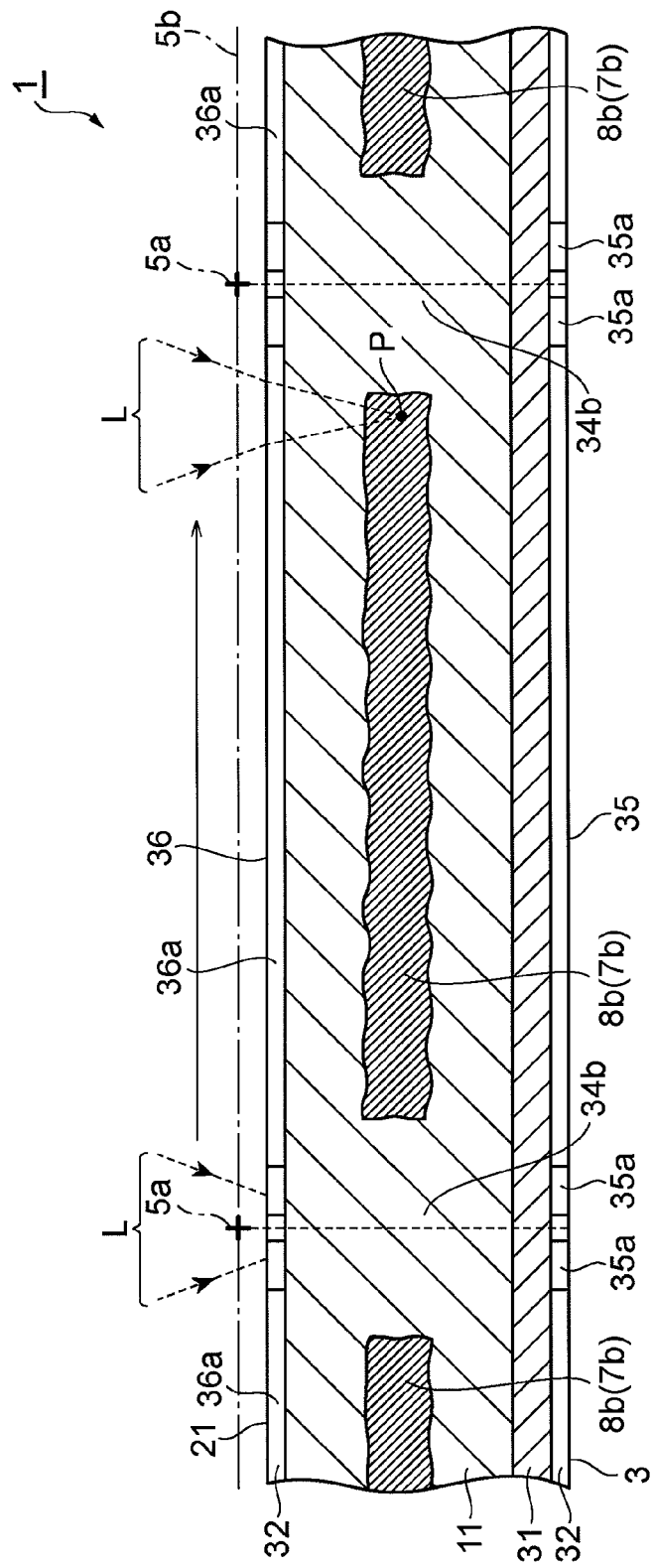
FIG. 14 is a partly enlarged longitudinal sectional view of the object of FIG. 12 taken along a line to cut extending along the stripe direction between semiconductor laser parts.

Subsequently, as illustrated in FIG. 14, the object 1 is irradiated with the laser light L while using its rear face 21 as a laser light entrance surface and locating a converging point P within the semiconductor substrate 11, and the support table is moved, so as to scan the laser light L along the lines to cut 5b. Here, since the cathodes 36 are formed with the gap of about several micrometers therebetween on both sides of the lines to cut 5b, the laser light L is converged within the semiconductor substrate 11 only in the portions held between the cutouts 36a of the cathodes 36 on the lines to cut 5b. Consequently, as illustrated in FIG. 15, modified regions 7b including molten processed regions are formed in the object 1 along the lines to cut 5b in the parts extending along the lines to cut 5b excluding portions 34b intersecting the lines to cut 5a, so as to become starting point regions for cutting (second starting point regions for cutting) 8b.

Here, the starting point regions for cutting 8b are formed such that the cutting force required for cutting the object 1 along the lines to cut 5b from the starting point regions for cutting 8b acting as a start point is greater than the cutting force required for cutting the object 1 along the lines to cut 5a from the starting point regions for cutting 8a acting as a start point. Specifically, the number of rows of the modified regions 7b formed per line to cut 5b is made smaller than the number of rows of the modified regions 7a formed per line to cut 5a or the intensity of the laser light L irradiating the lines to cut 5b is made lower than the intensity of the laser light L irradiating the lines to cut 5a, for example.

Figure 16:
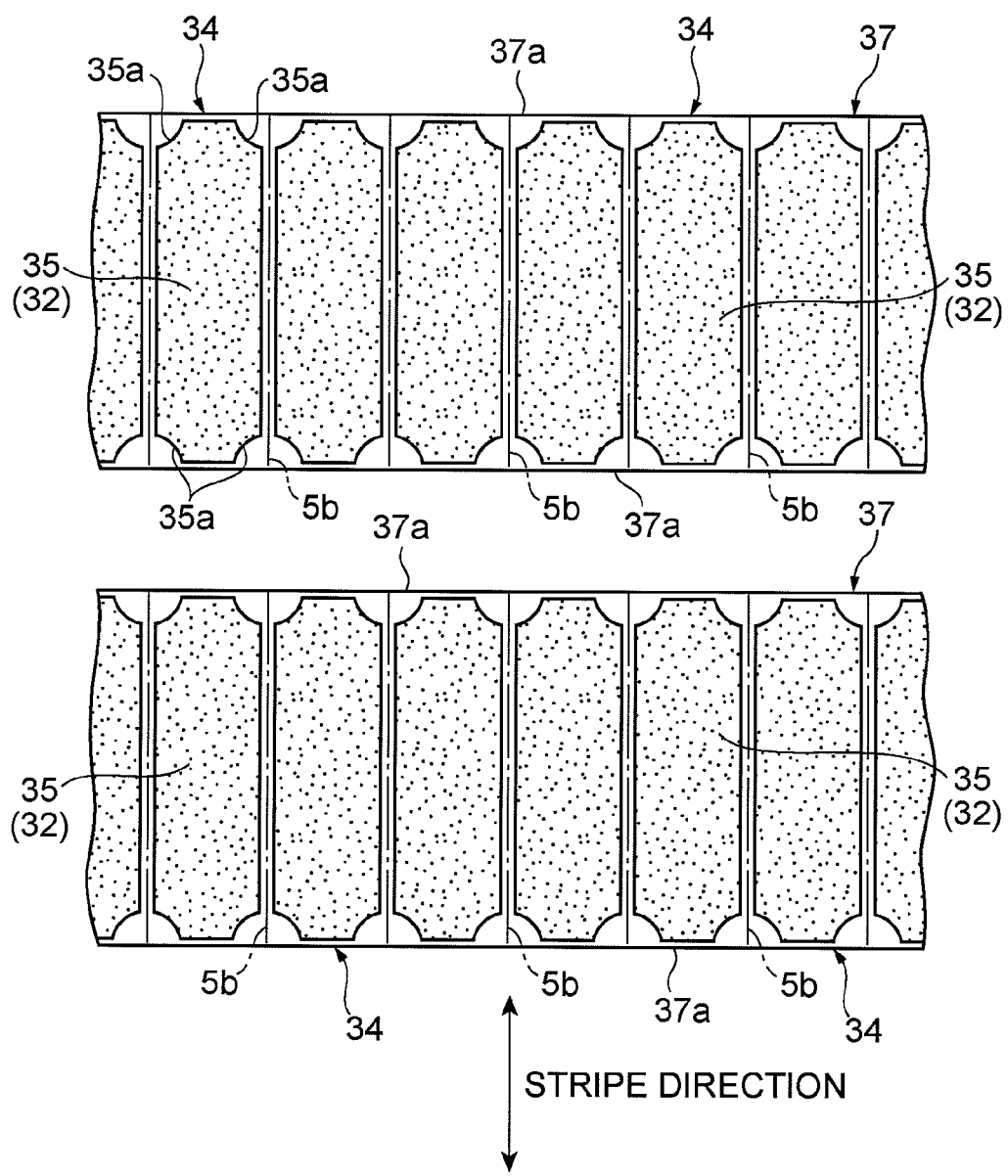
FIG. 16 is a partly enlarged view on the front face side of bars obtained by cleaving the object of FIG. 11.

Subsequently, as illustrated in FIG. 16, the object 1 is cleaved along the lines to cut 5a from the starting point regions for cutting 8a acting as a start point, so as to yield a plurality of bars 37 each having a plurality of semiconductor laser parts 34 arranged one-dimensionally.

Figure 17:
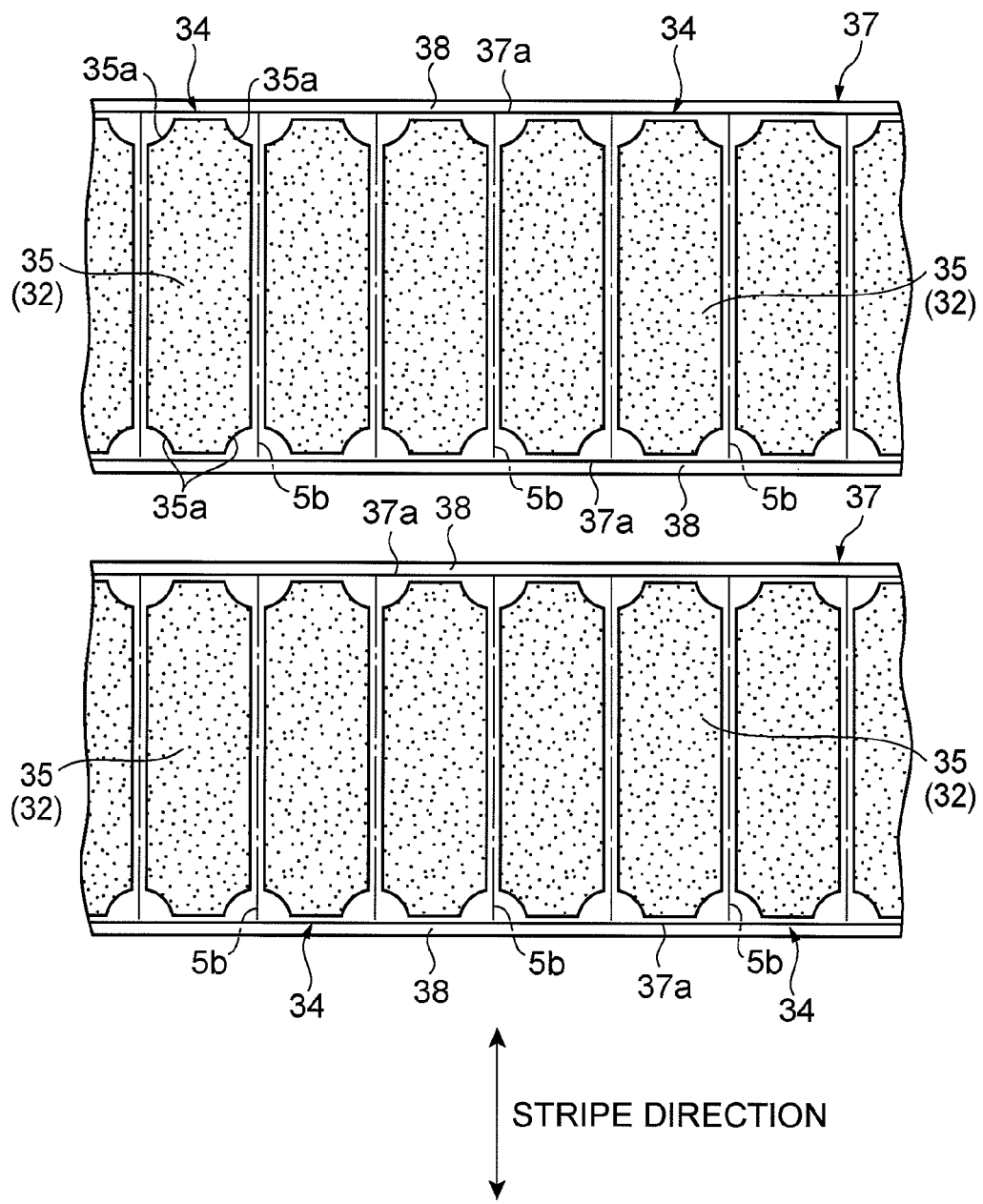
FIG. 17 is a partly enlarged view on the front face side of the bars of FIG. 16 after forming dielectric films.

Then, as illustrated in FIG. 17, dielectric films 38 are formed on cleavage surfaces (end faces of the bar 37 which are orthogonal to the stripe direction) 37a of each bar 37. This allows protective films or reflection control films to be efficiently formed in the portions 34a to become the resonance surfaces of the semiconductor laser elements. The dielectric layer films 38 are formed by laminating dielectrics such as $Al_2O_3$, $Si_2O_3$, and $Si_3N_4$ with predetermined thicknesses by vapor deposition or sputtering. When manufacturing semiconductor laser elements with a particularly high output, the dielectric films 38 are low-reflecting films having a reflectance of about 5% on one end face side and high-reflecting films having a reflectance of about 95% on the other end face side.

Figure 18:
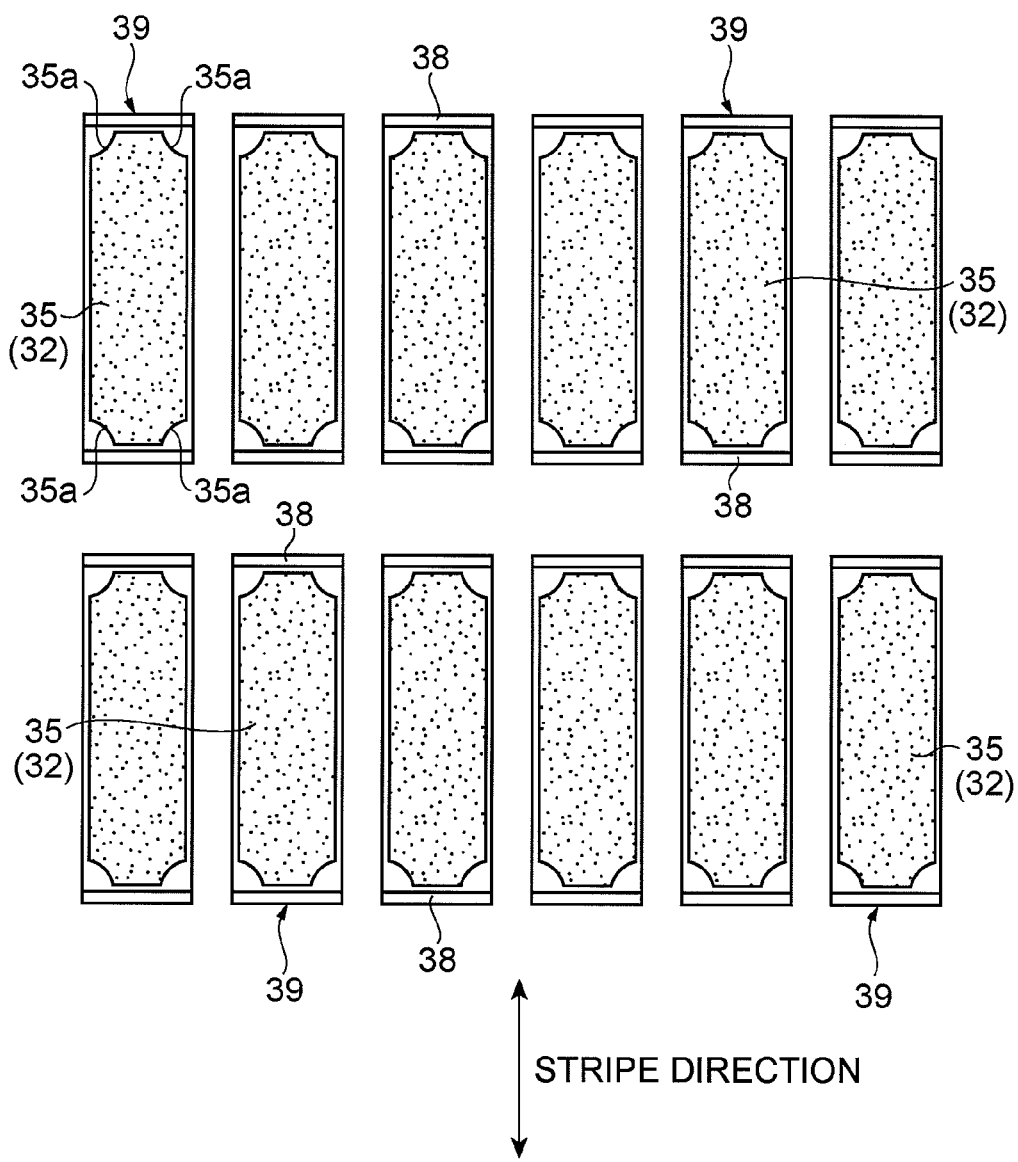
FIG. 18 is a partly enlarged view on the front face side of semiconductor laser elements obtained by cleaving the bars of FIG. 17.

Subsequently, as illustrated in FIG. 18, each bar 37 is cleaved along the lines to cut 5b from the starting point regions for cutting 8b acting as a start point, so as to yield a plurality of semiconductor laser elements 39.

As explained in the foregoing, the method of manufacturing a semiconductor laser element in accordance with this embodiment initially forms both of the starting point regions for cutting 8a extending along the lines to cut 5a and the starting point regions for cutting 8b extending along the lines to cut 5b in the object 1. Here, the starting point regions for cutting 8b have modified regions 7b formed by irradiating the object 1 with the laser light L while locating the converging point P within the object 1 and are formed along the lines to cut 5b in the parts extending along the lines to cut 5b excluding the portions 34b intersecting the lines to cut 5a. This makes the starting point regions for cutting 8b much less influential than scratches and the like, for example, when cutting the object 1 from the starting point regions for cutting 8a acting as a start point, whereby the bars 37 with precise cleavage surfaces 37a can be obtained. Therefore, it is unnecessary to form a starting point region for cutting along the lines to cut 5b in each of a plurality of bars 37, whereby the productivity of semiconductor laser elements 39 can be improved.

When forming the starting point regions for cutting 8a, 8b, the starting point regions for cutting 8b are formed along the lines to cut 5b such that the cutting force required for cutting the object 1 along the lines to cut 5b from the starting point regions for cutting 8b acting as a start point is greater than the cutting force required for cutting the object 1 along the lines to cut 5a from the starting point regions for cutting 8a acting as a start point. This can reliably prevent the object 1 from being cut from the starting point regions for cutting 8b acting as a start point when cutting the object 1 from the starting point regions for cutting 8a acting as a start point.

When forming the starting point regions for cutting 8a, 8b, not only the modified regions 7b to become the starting point regions for cutting 8b but also the modified regions 7a to become the starting point regions for cutting 8a are formed by irradiating the object 1 with the laser light L while locating the converging point P within the object 1. This allows both of the starting point regions for cutting 8a, 8b to be initially formed in the object 1 by a laser processing apparatus alone. The starting point regions for cutting 8a are formed in the object 1 along the lines to cut 5a in the parts extending along the lines to cut 5a excluding the portions to become the resonance surfaces 34a of the semiconductor laser elements 39. This can prevent the resonance surfaces of the semiconductor laser elements 39 from scattering the laser light and lowering the reflectance of the laser light.

If the semiconductor substrate 11 has an off angle in order to prevent lattice constants from misfitting between the semiconductor substrate 11 and the epitaxially grown crystal layer 31, cleavage surfaces formed by cleaving the bar 37 along the line to cut 5b extending in the stripe direction between the semiconductor laser parts 34, 34 from a scratch acting as a start point will tilt with respect to the front face 3 of the object 1. By contrast, the method of manufacturing a semiconductor laser element in accordance with this embodiment forms the modified regions 7b as the starting point regions for cutting 8b, whereby cross sections obtained when cutting the bars 37 along the lines to cut 5b can be made substantially perpendicular to the front face 3 of the object 1. This can inhibit the semiconductor laser elements 39 from chipping and reduce their mounting area.

The present invention is not limited to the above-mentioned embodiment.

For example, it will be sufficient if the starting point regions for cutting 5a for yielding a plurality of bars 37 by cleaving the object 1 are formed in at least a part of the lines to cut 5a, such as both end portions thereof. The starting point regions for cutting 8a are not limited to those having the modified regions 7a, but may be scratches and the like.

Though the anodes 35 having a light-shielding property are provided with the cutouts 35a so as to form the starting point regions for cutting 8a in the object 1 along the lines to cut 5a in the parts extending along the lines to cut 5a excluding the portions 34a to become the resonance surfaces of the semiconductor laser elements 39, it is not limitative. Other examples include turning on/off the irradiation with the laser light L with a shutter or the like and switching the mode of oscillation of the laser light L between a pulsed wave and a continuous wave, such that the modified regions 7a are selectively formed, so as to make the starting point regions for cutting 8a as mentioned above. This can form the starting point regions for cutting 8a before the anode layer 32. The same holds for the starting point regions for cutting 8b.

The anodes 35 are formed on both sides of the lines to cut 5a with a gap of several micrometers therebetween in order to block the laser light L and cleave the object 1 along the lines to cut 5a reliably with a high precision. The same holds for the cathodes 36. As the semiconductor laser elements 39 become smaller, they make it harder to turn on/off the irradiation with the laser light L and switch the mode of oscillation of the laser light L between a pulsed wave and a continuous wave, whereby forming the anodes 35 and cathodes 36 as mentioned above is very effective. Since the anodes 35 have the cutouts 35a at their four corners, an appropriate voltage can be applied to the semiconductor laser elements 39.

INDUSTRIAL APPLICABILITY

The present invention can improve the productivity of semiconductor laser elements.

The invention claimed is:

1. A method of manufacturing a semiconductor laser element having a stripe structure, the method comprising the steps of:

forming in an object to be processed having a plurality of two-dimensionally arranged semiconductor laser parts configured to become semiconductor laser elements a first starting point region for cutting along at least a part of a first cutting line extending orthogonal to a stripe direction between the semiconductor laser parts and irradiating the object with laser light while locating a converging point within the object, so as to form a second starting point region for cutting having a modified region along the stripe direction between the semiconductor laser parts;

cutting the object along the first cutting line from the first starting point region with the first starting point region acting as a start point, so as to yield a plurality of bars that are arranged one-dimensionally from a plurality of semiconductor laser parts, by cutting the object along the first cutting line at the first starting point region, after forming the first starting point region and the second starting point region; and cutting the bars along the second cutting line from the second starting point region with the second starting point region acting as a start point, so as to yield a plurality of semiconductor laser parts by cutting the bars along the second cutting line starting at the second starting point region, after yielding the plurality of bars.

2. A method of manufacturing a semiconductor laser element according to claim 1, wherein the step of forming the first and second starting point regions forms the second starting point region along the second cutting line such that a second cutting force required for cutting the object along the second cutting line from the second starting point region acting as a start point is greater than a first cutting force required for cutting the object along the first cutting line from the first starting point region acting as a start point.

3. A method of manufacturing a semiconductor laser element according to claim 1, wherein the step of forming the first and second starting point regions forms the second starting point region in the object along the second cutting line in a part extending along the second cutting line excluding a portion intersecting the first cutting line.

4. A method of manufacturing a semiconductor laser element according to claim 1, wherein the step of forming the first and second starting point regions irradiates the object with laser light while locating a converging point within the object, so as to form a first starting point region having a modified region along at least a part of the first cutting line.

5. A method of manufacturing a semiconductor laser element according to claim 4, wherein the step of forming the first and second starting point regions forms the first starting point region in the object along the first cutting line in a part extending along the first cutting line excluding a portion to become a resonance surface of the semiconductor laser element.

6. A method of manufacturing a semiconductor laser element according to claim 1 further comprising, between the step of yielding a plurality of bars and the step of yielding a plurality of semiconductor laser parts, the step of forming a dielectric film on an end face orthogonal to the stripe direction in the bars.

* * * * *